United States Patent
Kim

(10) Patent No.: US 6,838,754 B2
(45) Date of Patent: Jan. 4, 2005

(54) MULTI-CHIP PACKAGE

(75) Inventor: Tae-Hun Kim, Cheonan (KR)

(73) Assignee: Samsung Electroncs Co., LTD, Kyungki-Do (KR)

(*) Notice: Subject to any disclaimer, the term of this patent is extended or adjusted under 35 U.S.C. 154(b) by 0 days.

(21) Appl. No.: 10/621,581

(22) Filed: Jul. 18, 2003

(65) Prior Publication Data

US 2004/0113280 A1 Jun. 17, 2004

(30) Foreign Application Priority Data

Dec. 16, 2002 (KR) .................. 10-2002-0080363

(51) Int. Cl.[7] .................. H01L 23/495; H01L 23/48
(52) U.S. Cl. .................. 257/666; 257/783; 257/777; 257/787
(58) Field of Search .................. 257/666, 777, 257/783, 787, 781, 784, 786

(56) References Cited

U.S. PATENT DOCUMENTS

| 6,077,724 A | * | 6/2000 | Chen | 438/107 |
| 6,080,264 A | * | 6/2000 | Ball | 156/292 |
| 6,087,718 A | * | 7/2000 | Cho | 257/686 |
| 6,087,722 A | * | 7/2000 | Lee et al. | 257/723 |
| 6,265,762 B1 | * | 7/2001 | Tanaka et al. | 257/676 |
| 6,291,881 B1 | * | 9/2001 | Yang | 257/723 |
| 6,316,727 B1 | | 11/2001 | Liu | 174/52.4 |

FOREIGN PATENT DOCUMENTS

| KR | 2000-0010427 | 2/2000 |
| KR | 2001-0008926 | 2/2001 |

* cited by examiner

*Primary Examiner*—Jasmine Clark
(74) *Attorney, Agent, or Firm*—Harness, Dickey & Pierce P.L.C.

(57) ABSTRACT

A multi-chip package (MCP) that incorporates a leadframe pad arranged and configured to allow the active surface of a first chip to be mounted on a lower surface of the leadframe pad and a second chip to be mounted on an upper surface of the leadframe pad whereby the first and second chips may be mounted and wire bonded to inner leads without inverting the leadframe, thereby reducing the likelihood of damage during manufacturing and allowing for a reduction in package thickness. The first and second chips, as well as the bonding wires that connect the chips to inner leads of the leadframe may be sealed in a package body. Outer leads extending from the package body and integrally formed with the inner leads may be formed to provide finished packages having a variety of mounting configurations for attachment to circuit boards or other applications.

18 Claims, 16 Drawing Sheets

MULTI-CHIP PACKAGE

This U.S. nonprovisional patent application claims priority under 35 U.S.C. §119 from Korean Patent Application No. 2002-80363, filed on Dec. 16, 2002, the contents of which are herein incorporated by reference in their entirety.

BACKGROUND OF THE INVENTION

1. Field of the Invention

The invention relates to the field of semiconductor devices and, more particularly, to multi-chip packages and a method of forming such packages.

2. Description of the Related Art

In light of new developments in semiconductor technology and user demands, the electronics industry has been engaged in continuing efforts towards reducing the size, weight and power consumption of semiconductor devices. One technique utilized in these efforts is multi-chip packages (MCPs) in which a plurality of semiconductor chips are mounted in a single package.

Generally, MCPs utilize one of two main structural configurations, i.e., a chip stacking configuration or a parallel arrangement configuration. Chip stacking configurations may introduce difficulties associated with a more complex manufacturing process and complications or limitations associated with increased package thickness. Parallel arrangement configurations, while reducing some of the issues associated with chip stacking configurations, are generally more limited in their ability to reduce the overall size of the resulting package.

FIG. 1 is a cross-sectional view of a conventional stacked MCP. As illustrated in FIG. 1, the conventional MCP 210 has a first chip 211 and a second chip 213 attached on the lower and upper surfaces of a leadframe pad 221 with adhesive layers 231 and 235, respectively. The leadframe pad 221 may include a recess formed in the upper surface for receiving chip 213 that will tend to reduce the overall thickness of the package 210. The first and second chips 211 and 213 are electrically connected to inner leads 223 through bonding wires 241 and 243. The first chip 211, the second chip 213 and the bonding wires 241 and 243 may then be sealed by a package body 251 in order to protect them from the external environment. Outer leads 225 are typically formed integrally with and electrically connected to the inner leads 223 and extend from the package body for the purpose of making external connections. The package body 251 may typically be formed from a conventional epoxy molding compound (EMC) or other suitable polymeric material.

A MCP as illustrated in FIG. 1 that combines two chips in a single package will tend to reduce the mounting area required when compared with two packages each having a single chip. However, the conventional process of manufacturing such a MCP requires a series of sequential steps, such as a first chip attaching step, a second chip attaching step, a first wire-bonding step and a second wire-bonding step, etc.

Because some of these steps must be performed on both sides of the leadframe, the leadframe will typically be inverted repeatedly during the process, increasing the risk of damage to structures arranged on the opposite side such as the first chip and/or the bond wires attaching the first chip to the leadframe. Further, because the surface opposite the active surface of the first chip is attached to the leadframe pad, the MCP design must allow sufficient height for the bond wire loops above the active surface, thereby increasing the package thickness. Furthermore, reducing the thickness of the mounting portion of the leadframe in order to reduce the overall thickness of the resulting device increases the complexity of forming the leadframe and increases the likelihood of mechanical failures and/or reliability issues associated with the reduced leadframe pad thickness.

SUMMARY OF THE INVENTION

One multi-chip package (MCP) according to an exemplary embodiment of the invention comprises a leadframe pad having a central opening around which a series of inner leads are arrayed and first and second chips having bonding pads formed on their active surfaces. The active surface of the first chip may be attached to a bottom surface of the leadframe pad using an adhesive tape in a manner that leaves the bonding pads clear of the leadframe pad. The surface opposite the active surface of the second chip is, in turn, attached on the top surface of the leadframe pad using an adhesive.

A first series of bonding wires is used to establish electrical connections between the bonding pads of the first chip and corresponding inner leads. A second series of bonding wires is used to establish electrical connections between the bonding pads of the second chip and corresponding inner leads. The first and second chips, inner leads and bonding wires are then sealed in a package body to improve the reliability and durability of the resulting device. Outer leads are typically formed integrally with the inner leads and extend from the package body for establishing an external electrical connection with the semiconductor chips. The outer leads may be sized, bent and/or otherwise formed to provide packages having a wide range of mount configurations or types. The adhesive, typically a non-conductive epoxy resin, preferably fills the space between the leadframe pad and the second chip including the central opening of the leadframe pad and covers a portion of the first bonding wires.

The first chip will preferably be either a center-pad-type chip, i.e., a chip in which the bonding pads are typically arranged in one or two rows along or adjacent a central axis of the chip, or a combination-pad-type chip, i.e., one in which the bonding pads are arranged both in one or more rows adjacent a central axis and in rows along the opposing edges of the chip perpendicular and/or parallel to the central axis. The first chip is preferably attached to the lead frame in a manner that prevents any of the bonding pads from being obstructed by the leadframe pad.

If the first chip is the center-pad-type, the bonding pads will preferably be exposed within the opening provided in the leadframe pad. If the first chip is the combination-pad-type, however, the central bonding pads will preferably be exposed within the opening provided in the leadframe pad while the bonding pads formed along the edges may be exposed either inside or outside the opening in the leadframe pad. Although the second chip may be either the center-pad-type or an edge-pad-type or peripheral-pad-type chip, i.e., a chip in which the bonding pads are arranged along the periphery of the chip, a peripheral-pad-type chip is preferred.

BRIEF DESCRIPTION OF THE DRAWINGS

The features and advantages of the invention will be readily understood with reference to the detailed description provided below when read in conjunction with the accompanying drawings, wherein the same reference numerals are used to designate similar or corresponding structural elements, in which.

DETAILED DESCRIPTION OF EXEMPLARY EMBODIMENTS

Exemplary embodiments of the invention are described below with reference to certain of the accompanying drawings.

Figure 1:
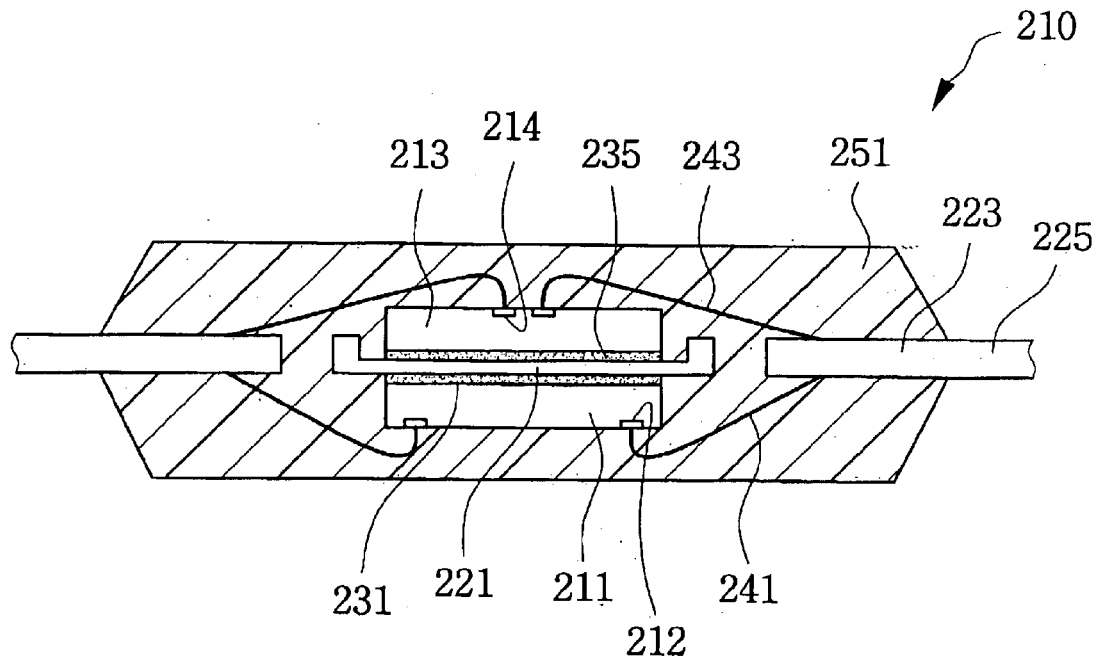
FIG. 1 is a cross-sectional view of an example of a conventional multi-chip package.
Figure 2:
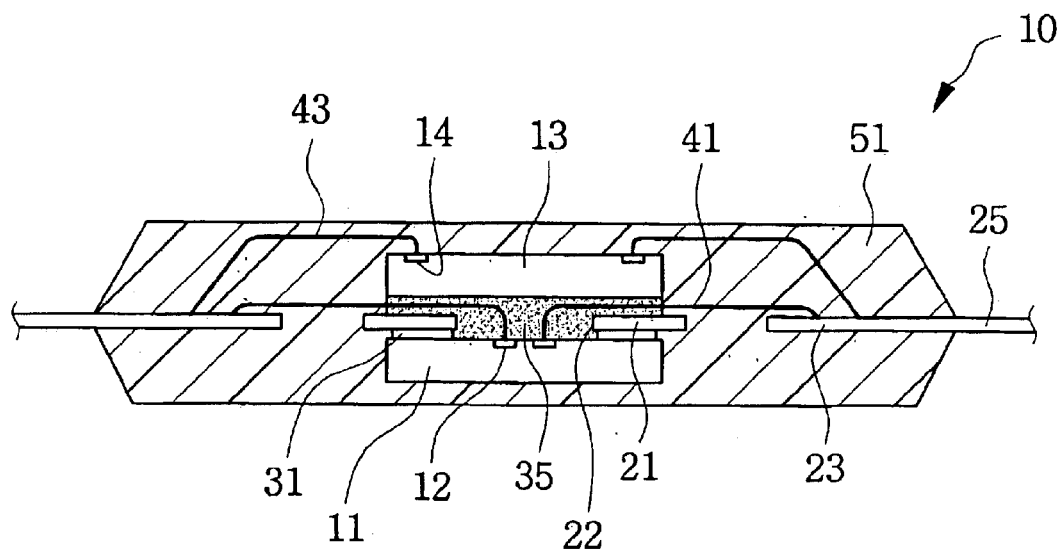
FIG. 2 is a cross-sectional view of a multi-chip package in accordance with a first exemplary embodiment of the invention.
Figure 3:
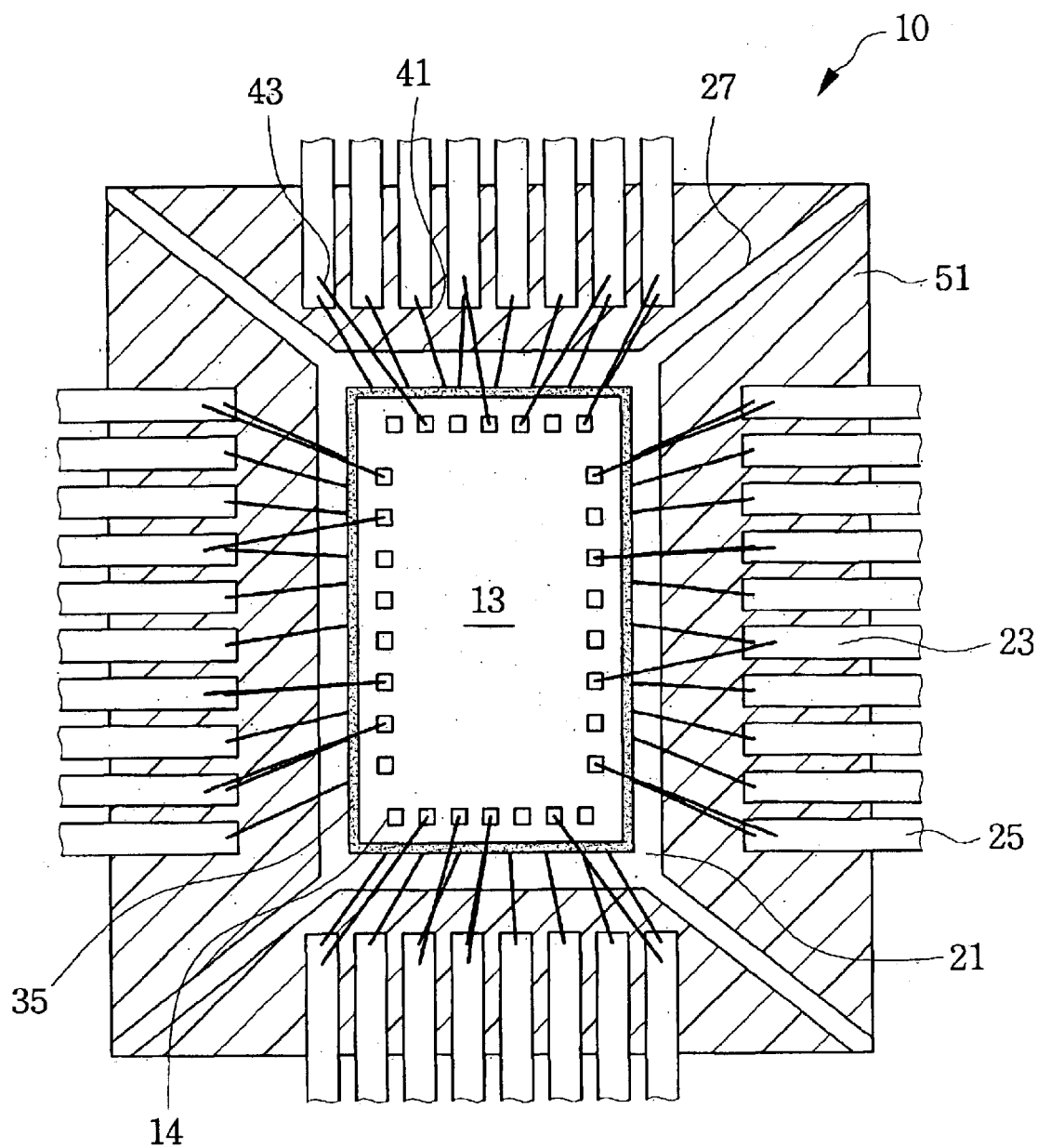
FIG. 3 is a top view of a multi-chip package in accordance with a first exemplary embodiment of the invention.

FIG. 2 is a cross-sectional view of a multi-chip package in accordance with a first exemplary embodiment of the invention while FIG. 3 is a corresponding top view of a multi-chip package in accordance with a first exemplary embodiment of the invention. As illustrated in FIGS. 2 and 3, a multi-chip package 10 comprises a first chip 11 and a second chip 13. A portion of the active surface of the first chip 11 is attached to a lower surface of leadframe pad 21. The side opposite the active surface of the second chip 13 is attached to an upper surface of the leadframe pad 21. The leadframe also includes inner leads 23 that are disposed around the leadframe pad 21. A first and second series of bonding wires 41, 43 are attached between chip bonding pads 12, 14 and the corresponding inner leads 23 to provide electrical connections between the chips 11, 13 and the leadframe.

The leadframe pad 21 may be formed as an open rectangle having a central opening 22. The relative sizing of the leadframe pad 21 and the central opening 22 are preferably configured to mount the first chip 11 size without obscuring the bonding pads 12. The illustrated exemplary embodiment incorporates a first combination-Pad-type chip 11 and a second edge-pad-type or peripheral-pad-type chip 12. The bonding pads 12 of the first chip 11 are disposed as two parallel lines adjacent a central axis of the chip and along the opposing edges perpendicular to the lines of center bonding pads. The bonding pads 14 of the second chip 13 are disposed along its periphery. As illustrated, both the first and second chips 11 and 13 are smaller than the leadframe pad 21 and may be mounted entirely within the outer periphery of the leadframe pad.

The first chip 11 includes a series of bonding pads 12 formed on an active surface thereof and is attached to a bottom surface of the leadframe pad 21 through adhesive means 31 in a manner that will expose the bonding pads within the central opening 22. The adhesive means 31 may be an adhesive tape, such as a polyimide tape, and is preferably arranged as a continuous band along the lower surface of the leadframe pad 21. The adhesive tape may utilize a single layer construction, such as a 25–50 $\mu$m polyimide film, or multi-layer construction incorporating materials with different properties, such as a polyolefin/polyimide/polyolefin structure, in which one or more of the outer layers has a lower melting point than the inner layer(s) and provide more of the adhesive effect. The thickness of the layers in a multi-layer adhesive tape may also be varied as necessary to achieve the desired performance, such as a 12.5 $\mu$m/25 $\mu$m/12.5 $\mu$m tri-layer film comprising two outer adhesive layers and a core layer of polyimide.

Such materials may be applied using equipment that can typically maintain mount stage temperatures of 300–350° C. and bond head temperatures of between about 200–250° C. In practice, however, the temperature range will typically be controlled within a more narrow range consistent with the particular materials selected and the process sequence utilized to achieve consistent bonding performance. The adhesive means 31 is preferred arraying in a continuous band for sealing the first chip 11 to the leadframe pad 21 so as to reduce leakage paths between the first chip and the leadframe during the subsequent application of an adhesive means 35. A first series of bonding wires 41 is then used to electrically connect bonding pads 12 on the first chip 11 to corresponding inner leads 23.

The second chip 13 having bonding pads 14 formed on an active surface may then be attached to the leadframe pad 21 by an adhesive means applied between the leadframe pad and the surface opposite the active surface, i.e., the backside. The adhesive means 35 may be a nonconductive epoxy resin adhesive, a non-conductive adhesive tape, or a combination of both adhesive tape and a liquid adhesive applied sequentially or substantially simultaneously.

Liquid adhesives may also include spacer or filler particles, for instance spherical particles, that will tend to limit the minimum spacing between the second chip and the leadframe pad, thereby protecting the first series of bonding wires from contact with the backside of the second chip. Whatever adhesive means is selected, however, it will preferably be applied in a manner that substantially fills the space between the active surface of the first chip 11 and the surrounding portions of the leadframe pad and the backside of the second chip 13, including the central opening 22.

Once the second chip 13 is mounted to the leadframe pad 21, a second series of bonding wires 43 may then be used to electrically connect bonding pads 14 on the second chip to corresponding inner leads 23. A portion of the first series of bonding wires 41 that extends under the second chip 13 and over the upper surface of the leadframe pad will generally be encapsulated by the adhesive means 35. This encapsulation will preferably provide some measure of both physical protection and electrical insulation for the bonding wires.

The first and second chips 11 and 13, the first and second series of bonding wires 41 and 43 and the inner leads 23 are then preferably sealed in a package body 51 in order to protect them from the external environment, thereby increasing the durability and improving the reliability of the device operation. The package body 51 will typically be formed from an epoxy molding compound (EMC) or other thermoset polymer composition, but other materials such as ceramics or thermoplastics may be warranted for certain applications.

Outer leads 25 are formed integrally with the inner leads 23 and extend from the package body 51 for providing electrical connections to the encapsulated chips. The outer leads 25 may be sized, bent and/or otherwise formed to provide packages having a wide range of mount configurations. Both conventional mount configurations including DIP (dual inline package), SIP (single inline package), ZIP (zig-zag inline package), SOJ (small outline J-leads), SSOP (shrink small outline package), TSOP (thin small outline package), QFP (quad flat package) and TQFP (thin quad flat package) and custom or proprietary mount configurations including straight, gullwing, j-type or other lead constructions can be made from or attached to the outer leads.

In accordance with the first exemplary embodiment of the invention, the first and second chips 11 and 13 are attached to the leadframe pad 21 in such a manner that the active surfaces of both chips face upward, thereby eliminating the need to invert the leadframe in order to perform the chip attachment and wire-bonding processes on both of the chips. The bonding wires 41 pass through the central opening 22 and are, in turn, at least partially covered with the adhesive means 35 used for mounting the second chip 13 and thus are both electrically isolated and physically protected from both the leadframe pad 21 and the backside of the second chip.

Figure 4A:
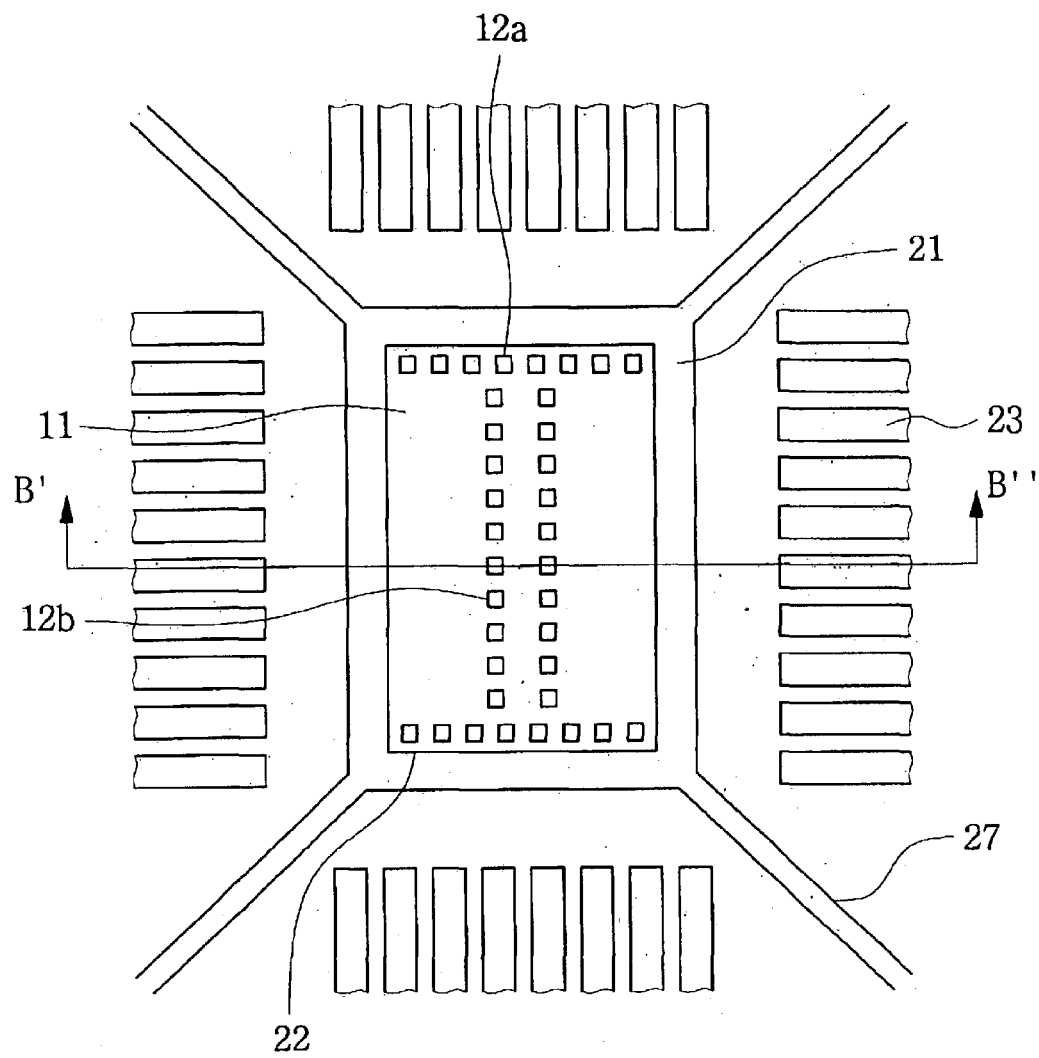
FIG. 4a is a top view of a multi-chip package in accordance with a first exemplary embodiment of the invention in which the first chip is a combination-pad-type chip with the edge pads exposed within the opening in the leadframe pad.
Figure 4B:
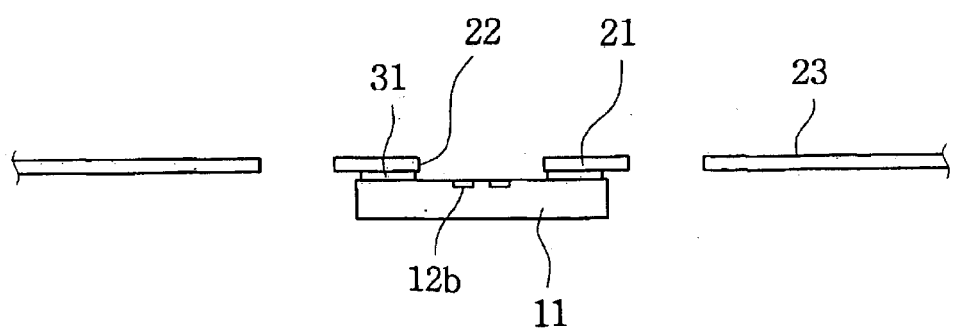
FIG. 4b is a cross-sectional view of a multi-chip package in accordance with a first exemplary embodiment of the invention as illustrated in FIG. 4a taken generally along line B'-B"

An exemplary manufacturing sequence for a multi-chip package according to a first exemplary embodiment of the invention is illustrated in FIGS. 4a through 8b. As illustrated in FIGS. 4a and 4b, the active surface of a first chip 11 is attached to a bottom surface of an open rectangular leadframe pad 21 using an open rectangular section of adhesive tape 31. The first chip 11 is a combination-pad-type chip having peripheral or edge bonding pads 12a and central bonding pads 12b arranged on the active surface. The leadframe pad 21 is configured and the first chip 11 is attached in a manner that both sets of bonding pads 12a, 12b are exposed within a central opening 22 of the leadframe pad. The adhesive tape 31 may be a polyimide tape. The leadframe pad 21 is supported within the leadframe and positioned relative to inner leads 23 by a series of tie bars 27.

Figure 5A:
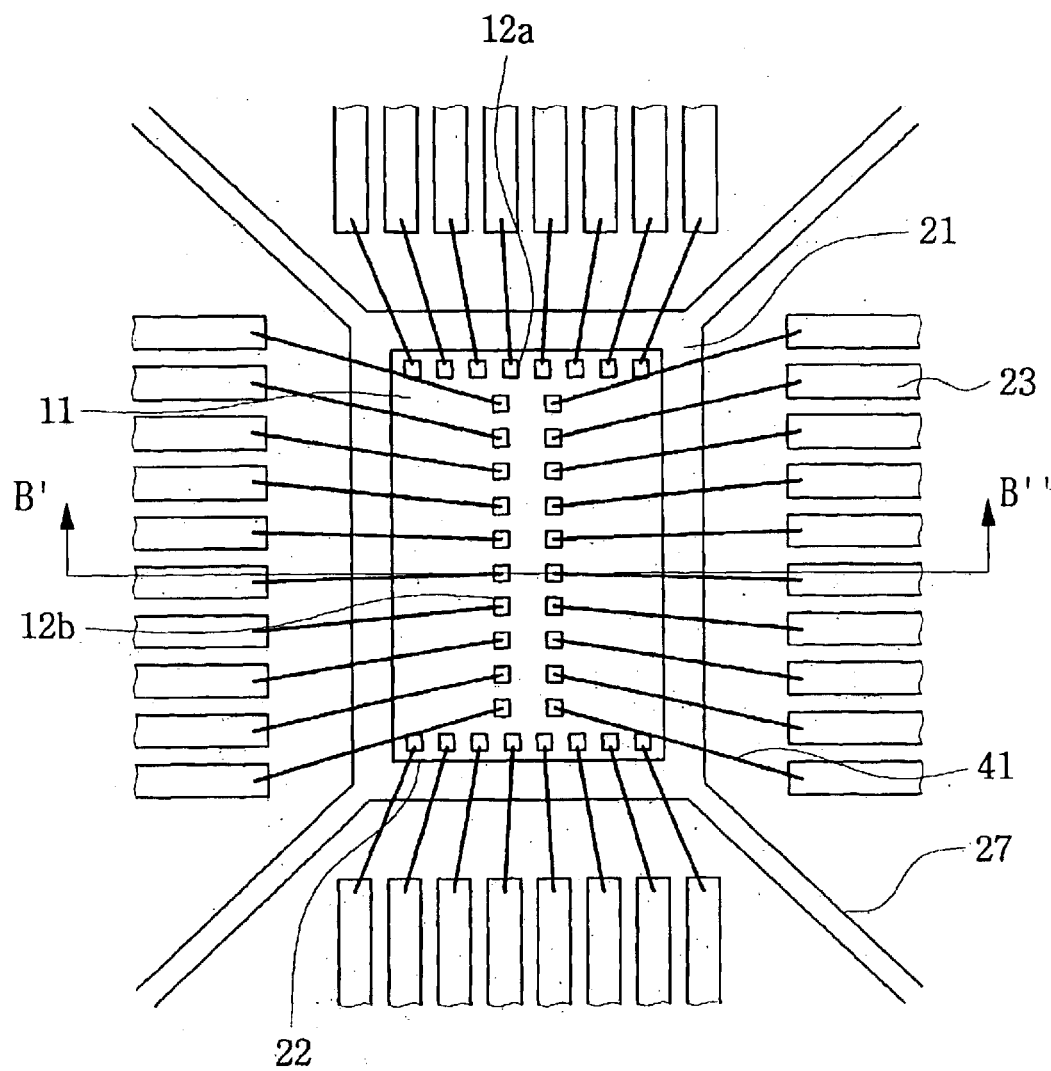
FIG. 5a is a top view of a multi-chip package in accordance with a first exemplary embodiment of the invention as illustrated in FIG. 4a with a first series of bonding wires attached between the chip pads and corresponding inner leads.
Figure 5B:
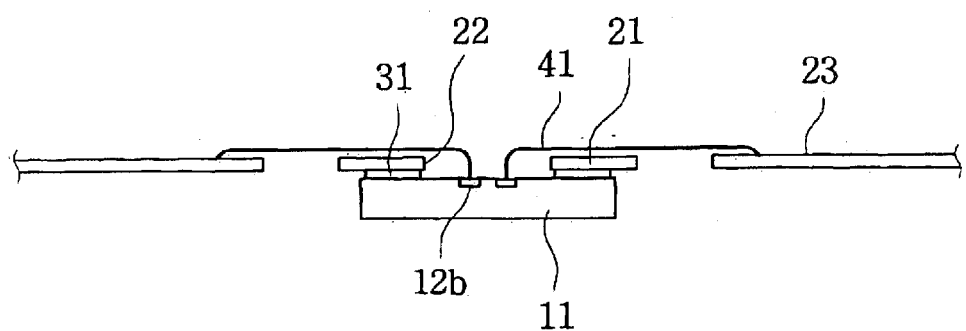
FIG. 5b is a cross-sectional view of a multi-chip package in accordance with a first exemplary embodiment of the invention as illustrated in FIG. 5a taken generally along line B'-B"

As illustrated in FIGS. 5a and 5b, after the first chip 11 is mounted to the leadframe pad, the bonding pads 12a and 12b may be electrically connected to the corresponding inner leads 23 by a first series of bonding wires 41. The first bonding wires 41 pass down through the central opening 22 to reach the bonding pads, thereby reducing the height of the bond wire loop above the leadframe pad 21.

Figure 6A:
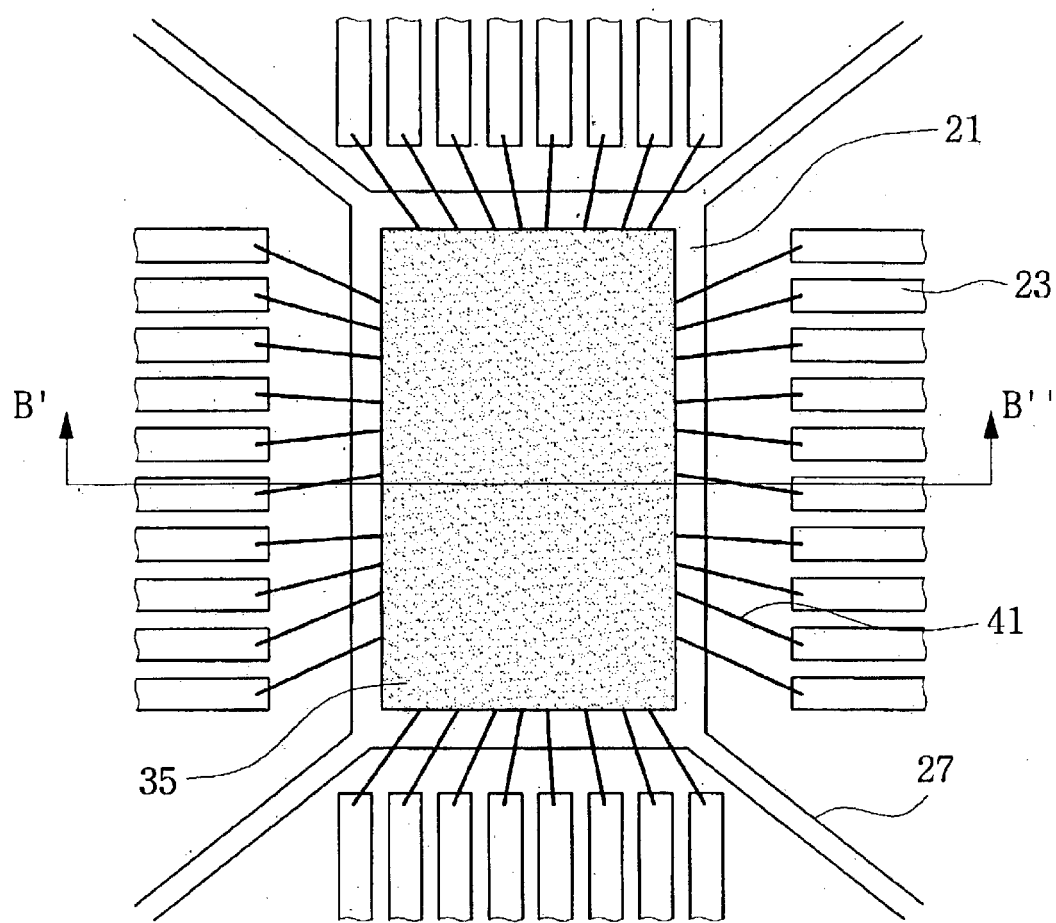
FIG. 6a is a top view of a multi-chip package in accordance with a first exemplary embodiment of the invention as illustrated in FIG. 5a with a layer of adhesive applied over the exposed surface of the first chip and portions of the first series of bonding wires.
Figure 6B:
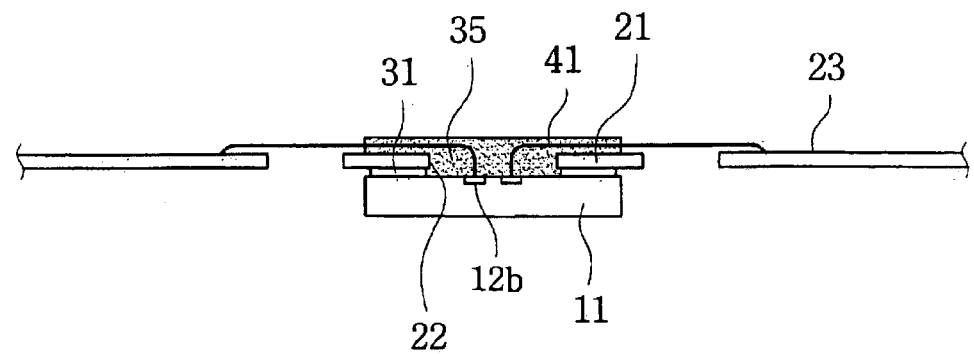
FIG. 6b is a cross-sectional view of a multi-chip package in accordance with a first exemplary embodiment of the invention as illustrated in FIG. 6a taken generally along line B'-B"

As illustrated in FIGS. 6a and 6b, a quantity of a non-conductive adhesive composition 35 is then applied to the active surface of the first chip 11 and a portion of the upper surface of the leadframe pad 21. The quantity of the adhesive composition is preferably sufficient to fill the central opening 22 and encapsulate a portion of the first bonding wires 41 that extends above the first chip and across the leadframe pad 21. As applied, the adhesive composition 35 may incorporate solid spacer particles (not illustrated) that are sized to limit the minimum spacing between the backside of the second chip 13 and the upper surface of the leadframe pad. This minimum spacing is preferably selected to ensure that the backside of the second chip 13 does not contact any of the first series of bonding wires 41 and that sufficient electrical insulation is provided by the encapsulating composition.

Figure 7A:
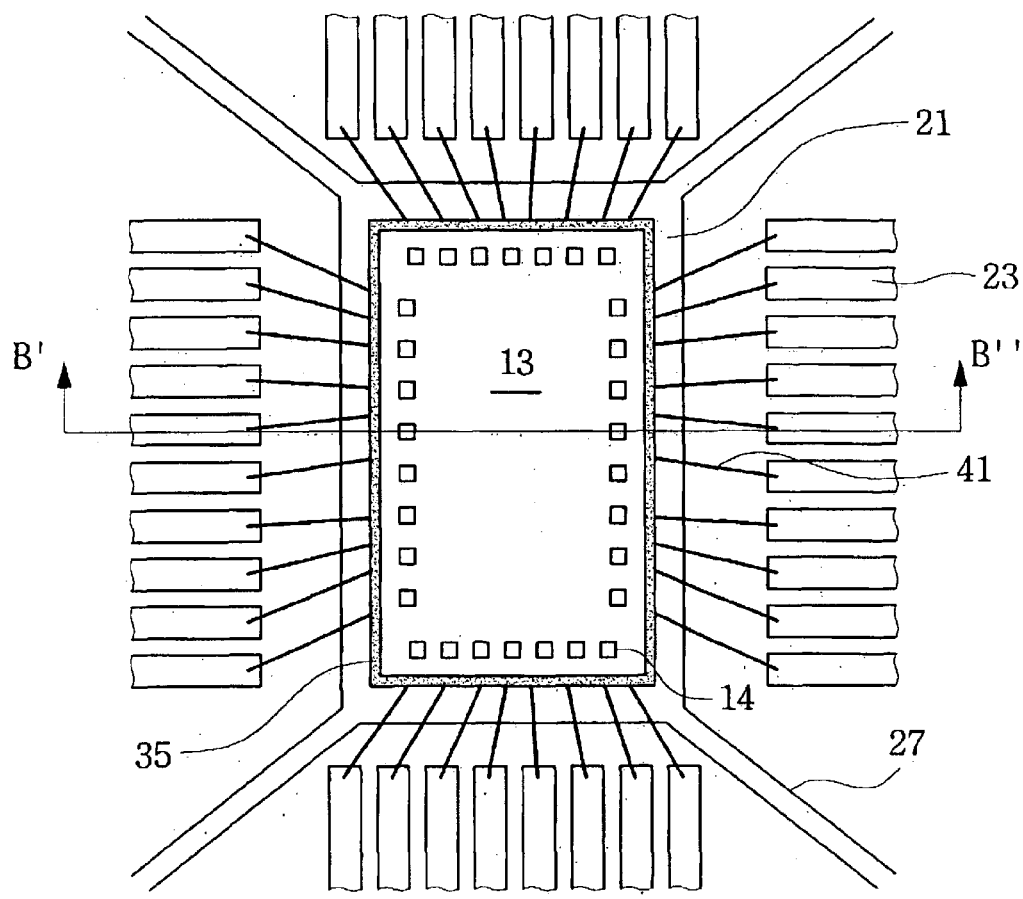
FIG. 7a is a top view of a multi-chip package in accordance with a first exemplary embodiment of the invention as illustrated in FIG. 6a with a second chip positioned on the adhesive layer.
Figure 7B:
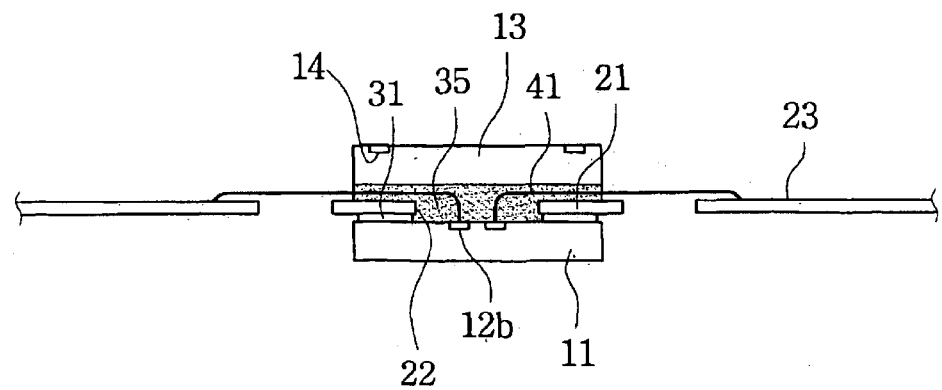
FIG. 7b is a cross-sectional view of a multi-chip package in accordance with a first exemplary embodiment of the invention as illustrated in FIG. 7a taken generally along line B'-B"

As illustrated in FIGS. 7a and 7b, the second chip 13 is then attached to the upper surface of the leadframe pad 21 by applying the backside of the second chip to the top surface of the adhesive composition 35. The second chip 13 is preferably an edge-pad or peripheral-pad-type chip with the bonding pads 14 being formed on the active surface.

Figure 8A:
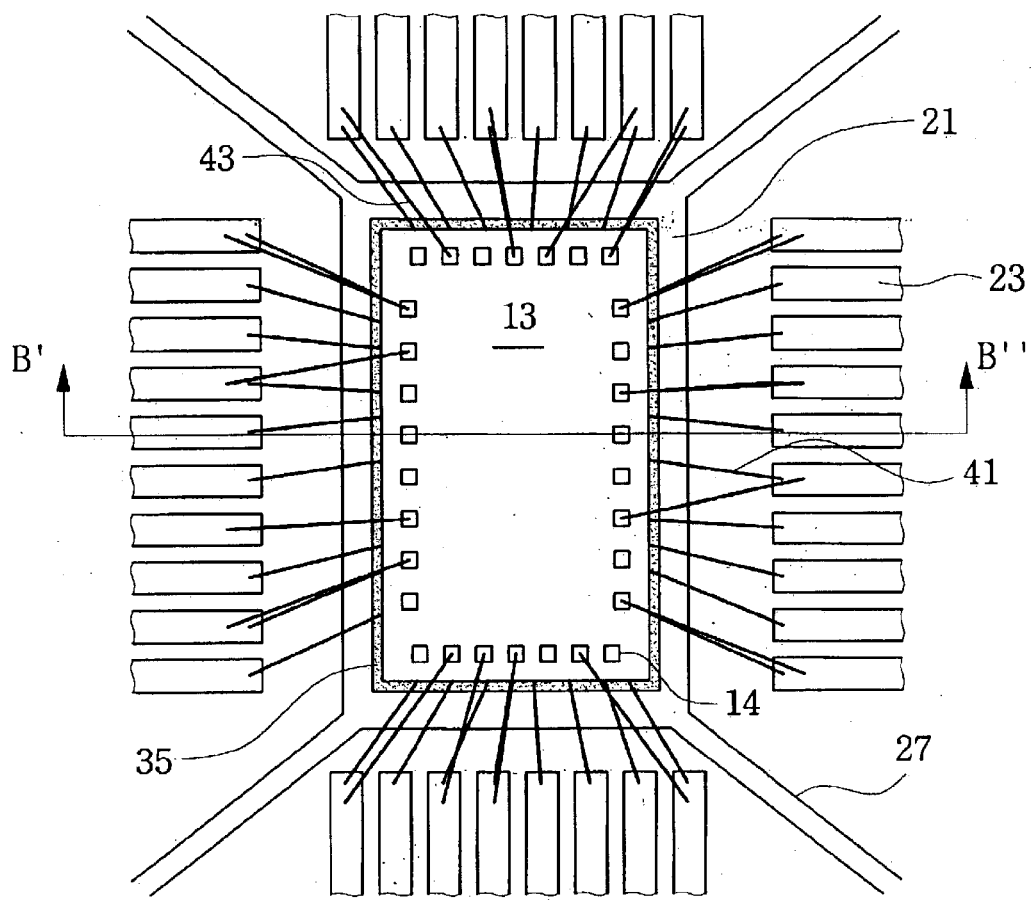
FIG. 8a is a top view of a multi-chip package in accordance with a first exemplary embodiment of the invention as illustrated in FIG. 7a with a second series of bonding wires attached between selected chip pads and corresponding inner leads.
Figure 8B:
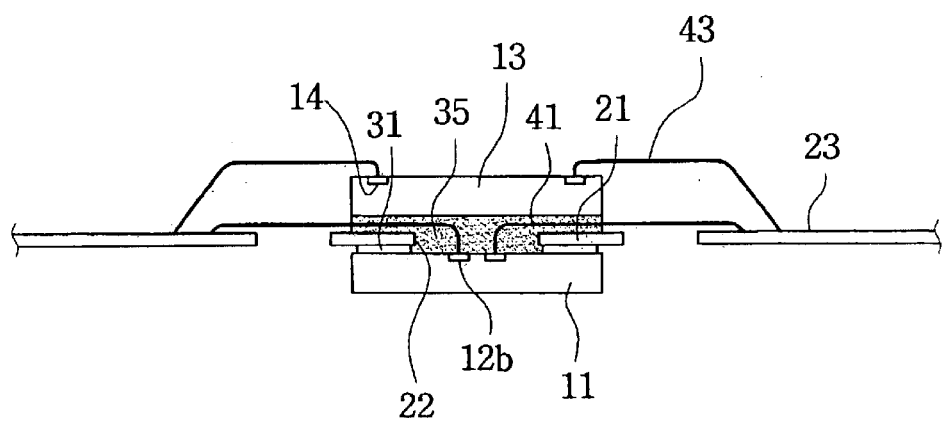
FIG. 8b is a cross-sectional view of a multi-chip package in accordance with a first exemplary embodiment of the invention as illustrated in FIG. 8a taken generally along line B'-B"

As illustrated in FIGS. 8a and 8b, the bonding pads 14 of the second chip 13 may then be electrically connected to the corresponding inner leads 23 using a second series of bonding wires 43.

As illustrated in FIGS. 2 and 3, a package body 51 may then be formed around the first and second chips 11 and 13, the inner leads 23 and the first and second series of bonding wires 41 and 43 by encapsulation with an EMC or other thermoset polymeric composition. The outer leads 25, typically integrally formed with the inner leads, provide an electrical connection to the inner leads 23 and extend beyond the package body to provide for electrical connection of the resulting package to a circuit board, socket or other mounting receptacle. The outer leads 25 may be sized, cut, trimmed, bent and/or otherwise formed to produce packages having a wide range of mount configurations.

Although, as illustrated, this exemplary embodiment provided that the bonding pads 12 of the first chip 11 were all exposed in the central opening 22 when the first chip was mounted to the leadframe pad 21, many variations and/or modifications in the chip and leadframe pad configurations may be accommodated by the invention. For example, the first chip 11 may be a center-pad-type, an edge-pad-type or other combination-pad-type chips. Furthermore, the first chip 11 may be connected to the leadframe pad 21 in a manner that places a number of the bonding pads 12 beyond the outer periphery of the leadframe pad.

Figure 9:
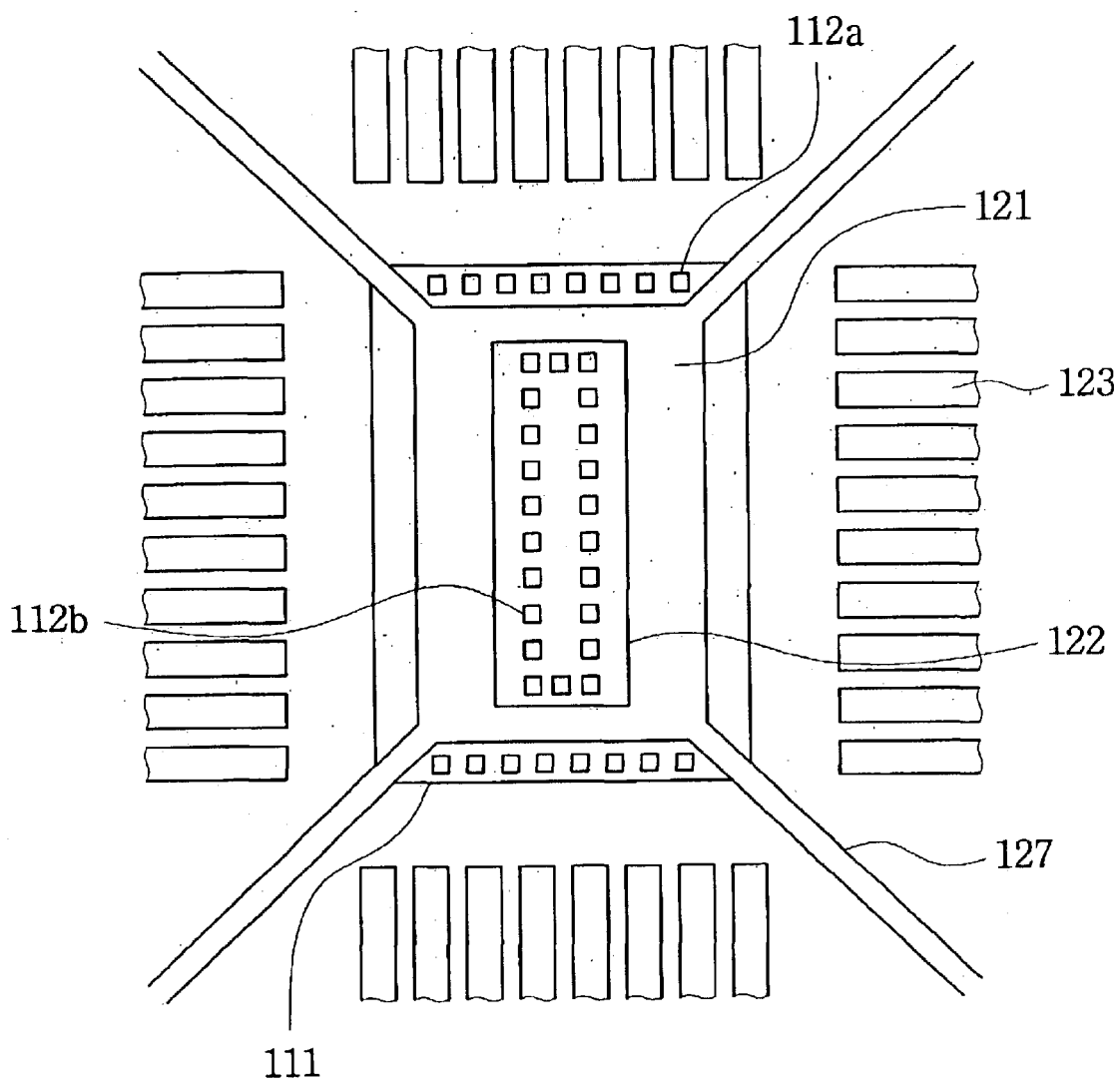
FIGS. 9 through 16 are top views illustrating an exemplary method for manufacturing multi-chip packages in accordance with a second exemplary embodiment of the invention.

FIGS. 9 through 16 are a series of top views illustrating an exemplary method for manufacturing multi-chip packages in accordance with a second exemplary embodiment of the invention. As illustrated in FIG. 9, the active surface of a first chip 111 is attached to a bottom surface of an open leadframe pad 121 using an adhesive tape 131. The first chip 111 is a combination-pad-type chip with bonding pads 112*a* and 112*b* provided on an active surface. In this exemplary embodiment, the first chip 111 is larger than the outer periphery of leadframe pad 121 and is attached in such a manner that bonding pads 112*a* are exposed outside the leadframe pad and bonding pads 112*b* are exposed within the central opening 122. The adhesive tape 131 may be a polyimide tape or another suitable composition of thermoset and/or thermoplastic polymeric materials. The leadframe pad 121 is supported within the leadframe by a series of tie bars 127.

Figure 10:
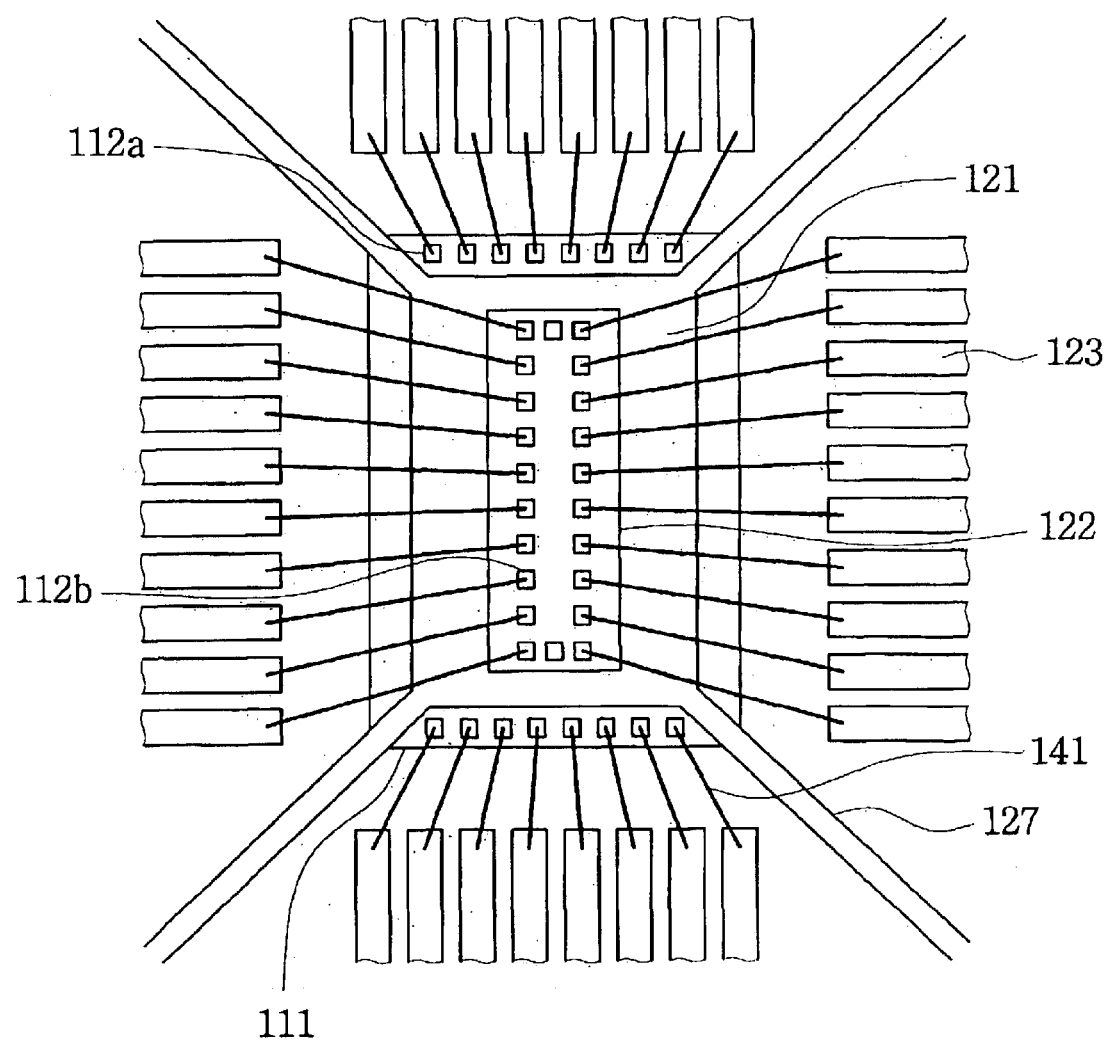

As illustrated in FIG. 10, the bonding pads 112*a* and 112*b* on the first chip 111 are electrically connected to the corresponding inner leads 123 through first bonding wires 141. The interconnection of the bonding pads 112*b* and the corresponding inner leads 123 involve passing bonding wires through the central opening 122 with the interconnection of the bonding pads 112*a* and the corresponding inner leads 123 may be directly performed without passing a bonding wire through the central opening 122. The first bonding wires 141 may start from the bonding pads 112*a* and 112*b* of the first chip 111 and keep a relatively horizontal orientation above the leadframe pad 121, thereby reducing the height of the wire loop relative to the leadframe pad 121 and allowing the overall thickness of the package to be reduced.

Figure 11:
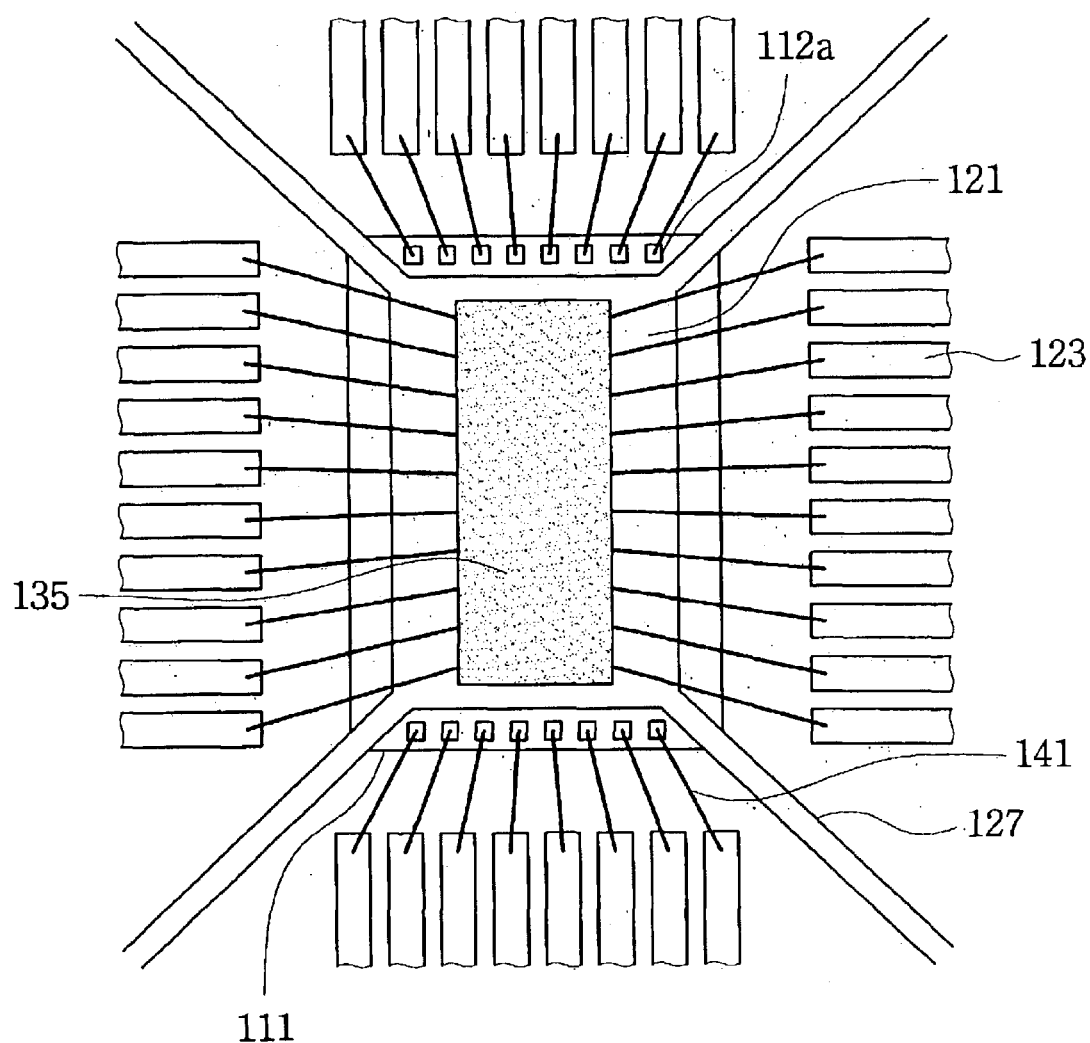

As illustrated in FIG. 11, a nonconductive adhesive 135 is applied to fill the area from the active surface of the first chip 111 to a level above the leadframe pad 121, thereby filling the central opening 122 and covering a portion of the first bonding wires 141.

Figure 12:
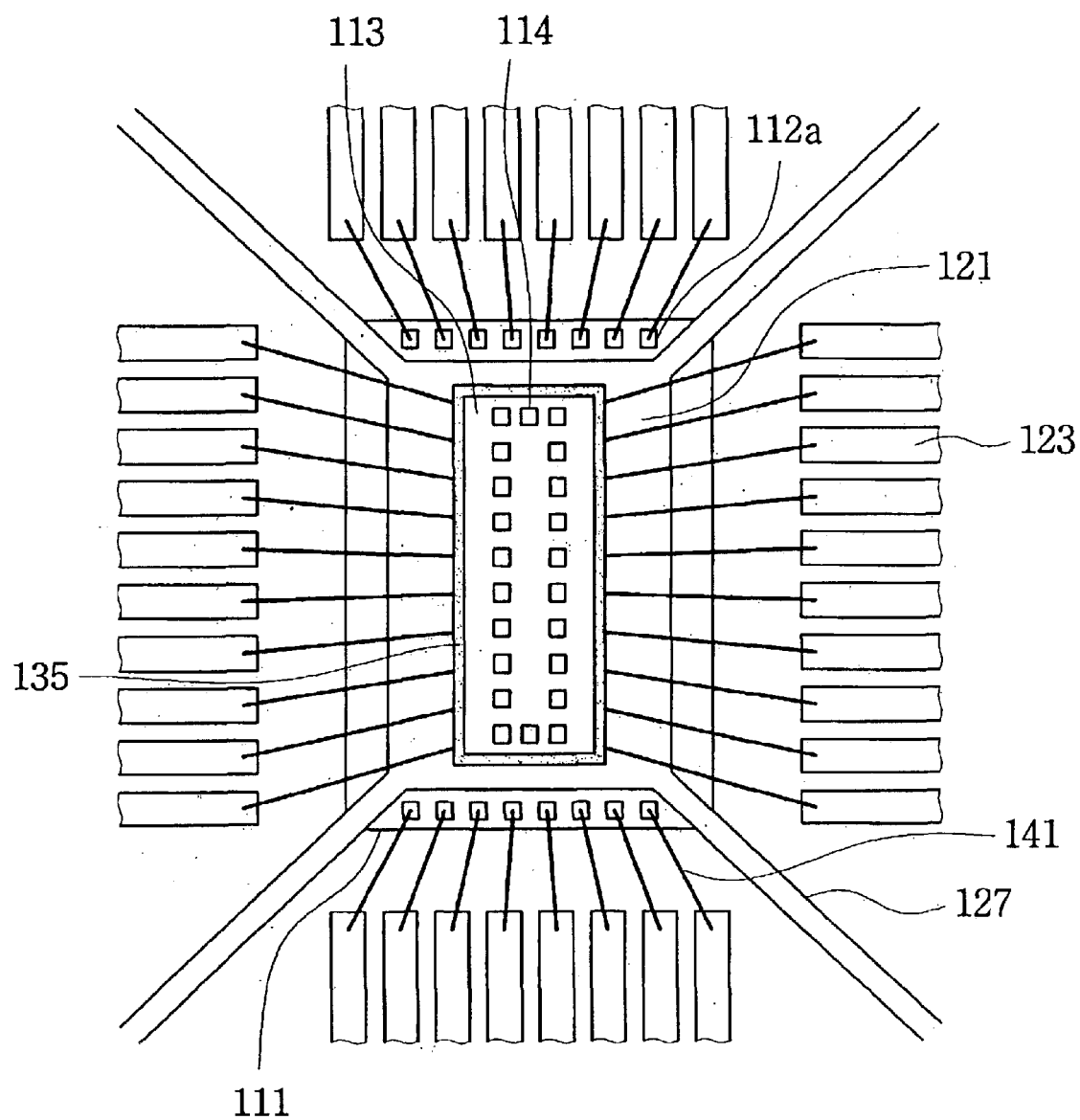
Figure 15:
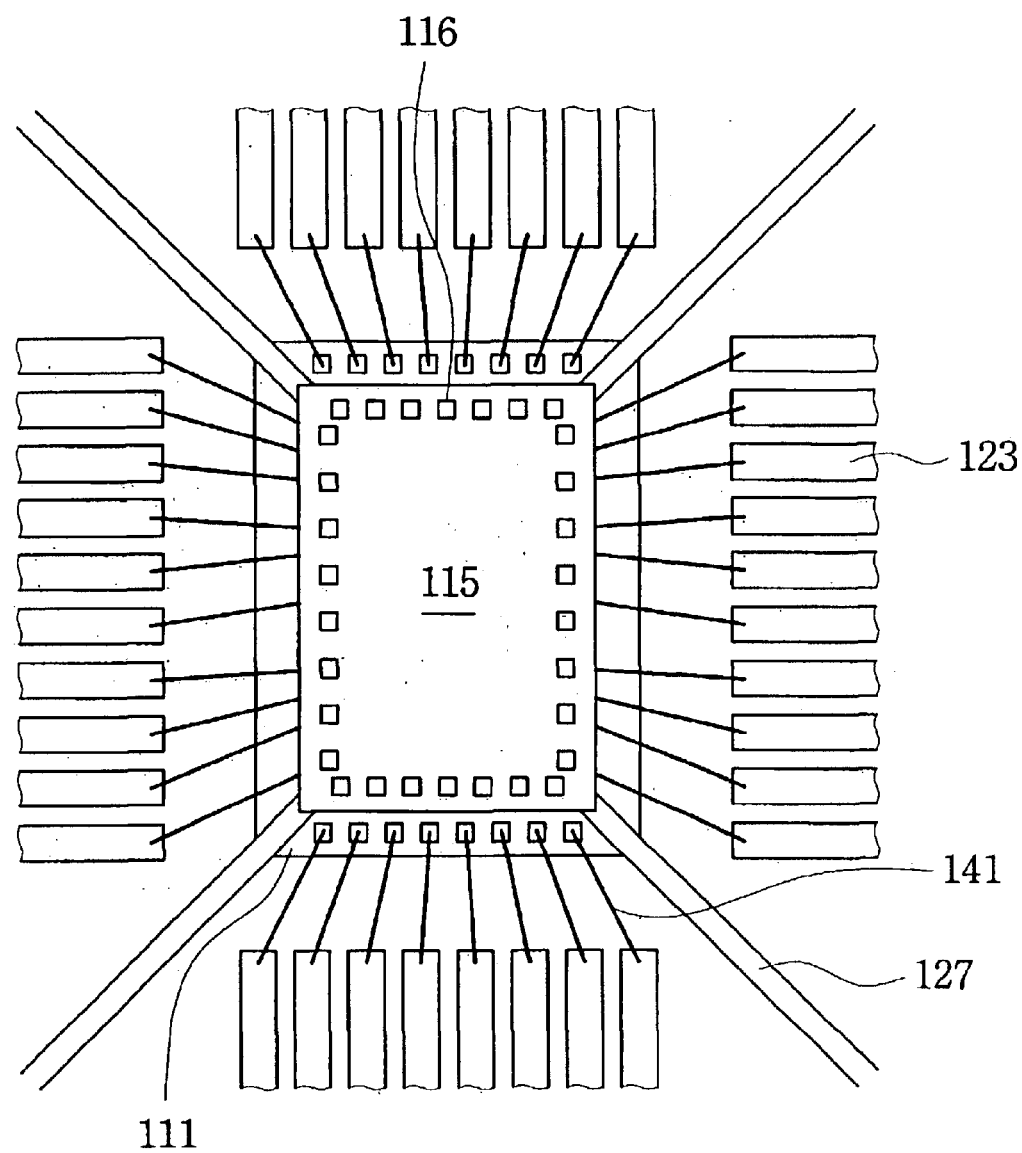

As illustrated in FIG. 12, the surface opposite to the active surface of a second chip 113 is attached to the top surface of the leadframe pad 121 by the adhesive 135. The second chip 113 is an edge-pad-type or peripheral-pad-type chip and has bonding pads 114 on an active surface thereof. Although the exemplary embodiment here illustrated incorporates a second chip 113 that is smaller than the leadframe pad 121, the second chip 115 may also be larger than the leadframe pad 121 as shown in FIG. 15.

Figure 13:
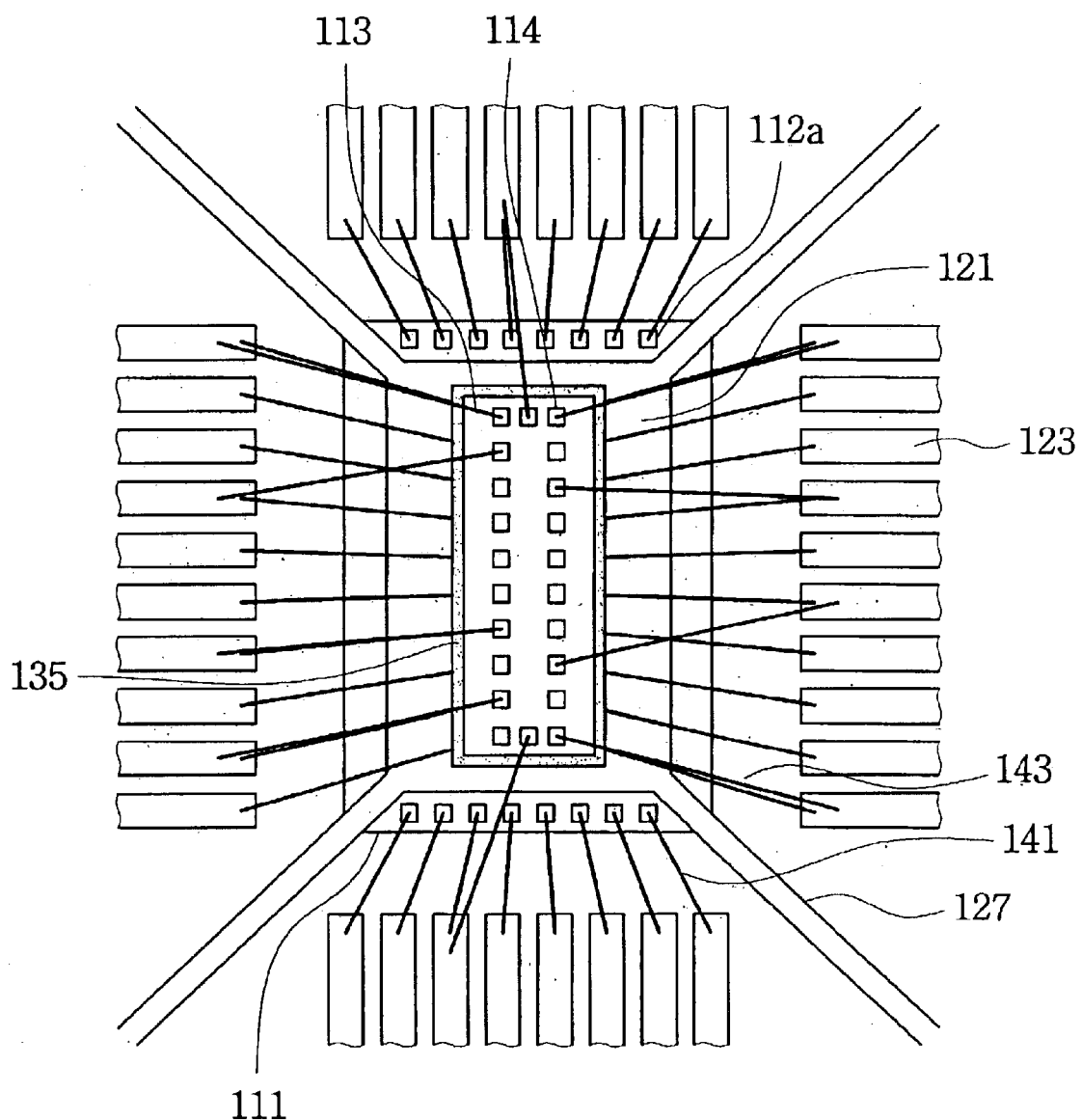
Figure 16:
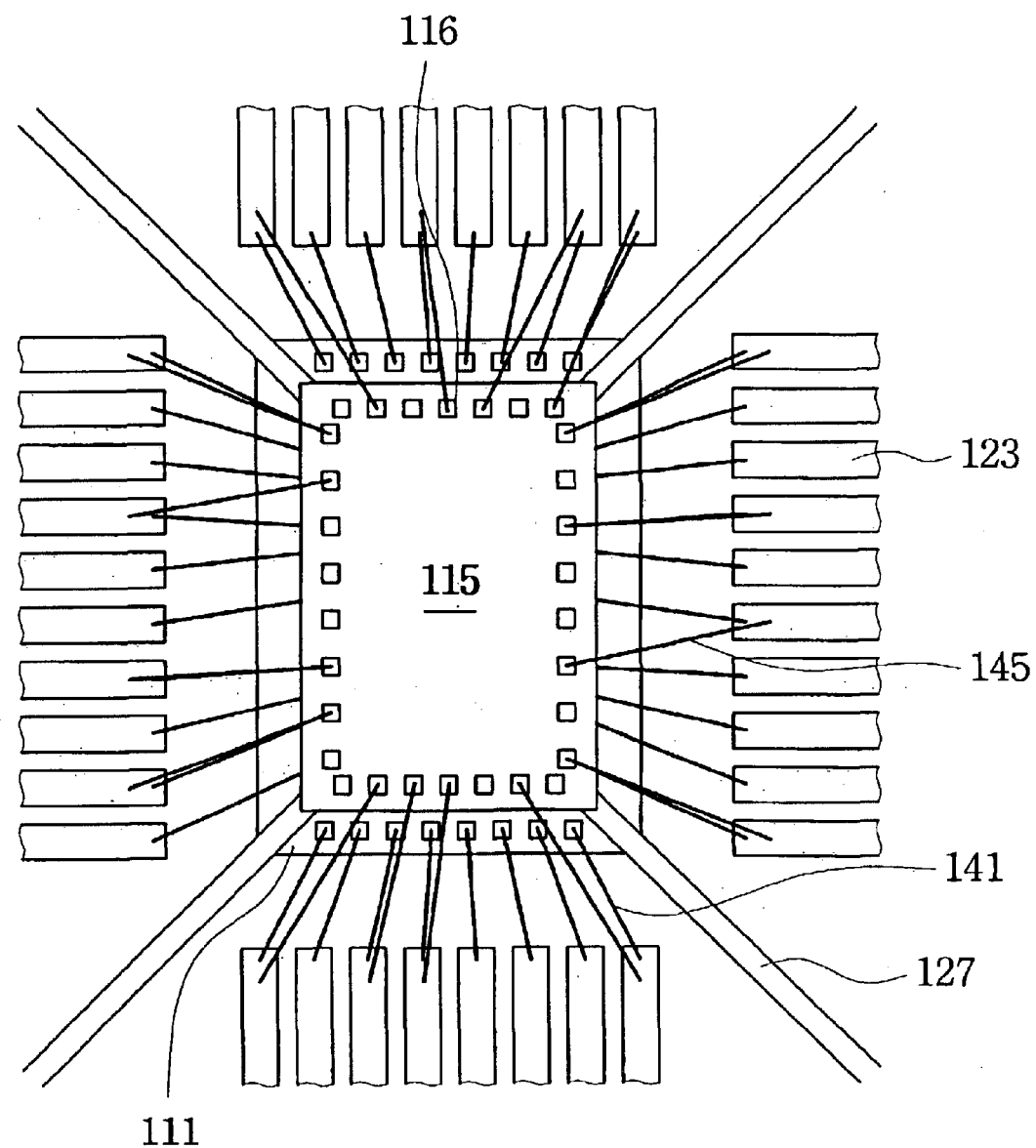

As illustrated in FIG. 13, the bonding pads 114 of the second chip 113 are electrically connected to the corresponding inner leads 123 with a second series of bonding wires 143. FIG. 16 shows an alternative exemplary embodiment in which the wire bonding operation has been performed on a second chip 115 that is larger than the leadframe pad 121.

Figure 14:
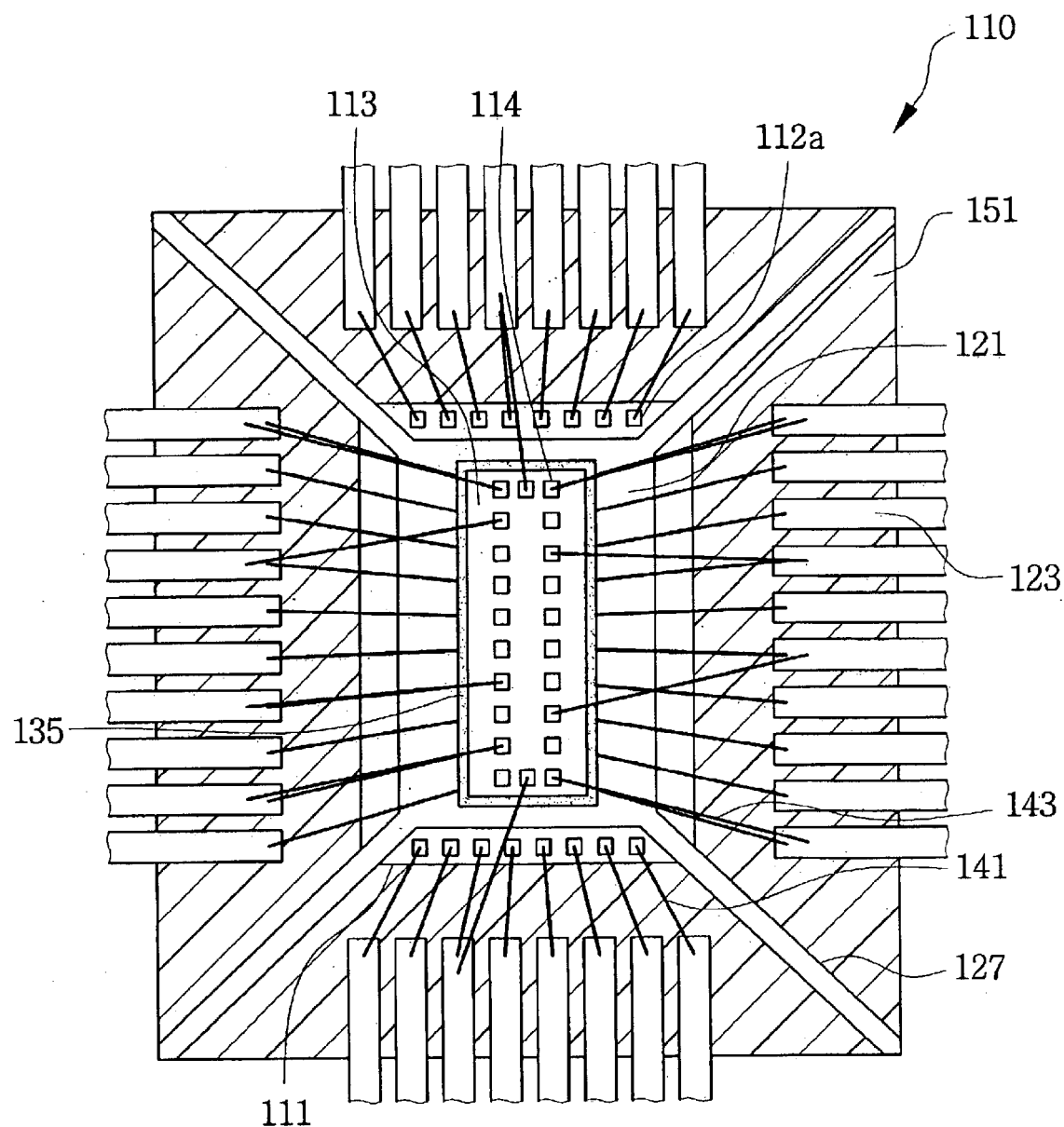

As illustrated in FIG. 14, a package body 151 may be formed by a molding process using an EMC or other suitable polymeric composition. The first and second chips 111 and 113 (or 111 and 115 as illustrated in FIG. 16), the inner leads 123 and the bonding wires 141 and 143 (or 141 and 145 as illustrated in FIG. 16) are encapsulated with an EMC or similar composition. The external portions (not shown) of the tie bars 127 may be removed by a trim/form process during which the outer leads 125 (not shown) are formed to produce the mount configuration desired for the final device.

Figure 17:
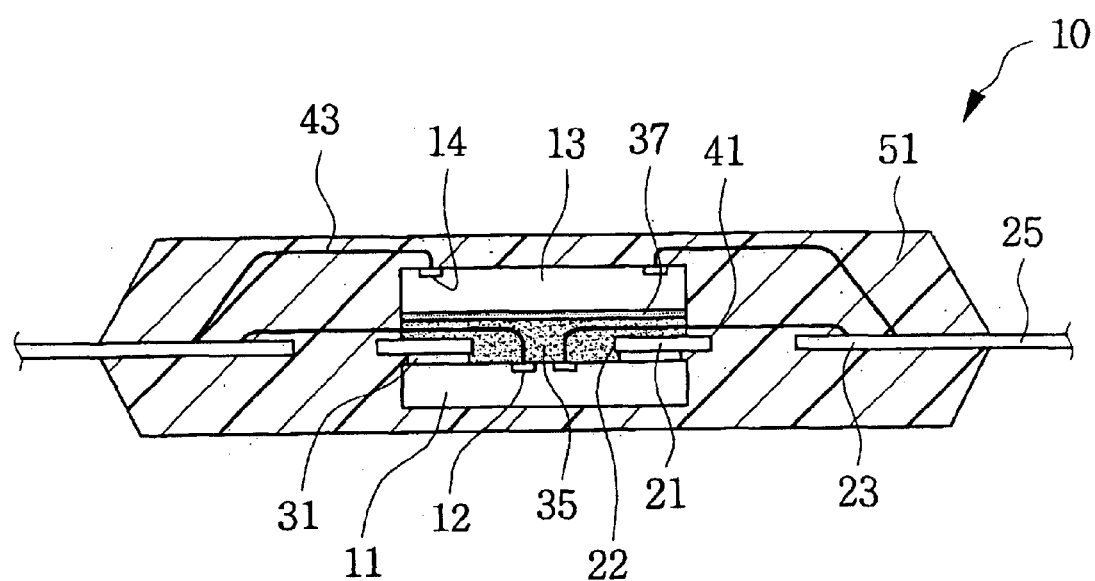
FIG. 17 is a cross-sectional view of a multi-chip package in accordance with a second exemplary embodiment of the invention.

As illustrated in FIG. 17, a multi-chip package 10 comprises a first chip 11 and a second chip 13. A portion of the active surface of the first chip 11 is attached to a lower surface of leadframe pad 21. The side opposite the active surface of the second chip 13 is attached to an upper surface of the leadframe pad 21. The leadframe also includes inner leads 23 that are disposed around the leadframe pad 21. A first and second series of bonding wires 41, 43 are attached between chip bonding pads 12, 14 and the corresponding inner leads 23 to provide electrical connections between the chips 11, 13 and the leadframe.

The leadframe pad 21 may be formed as an open rectangle having a central opening 22. The relative sizing of the leadframe pad 21 and the central opening 22 are preferably configured to mount the first chip 11 size without obscuring the bonding pads 12. This illustrated exemplary embodiment incorporates a first combination-pad-type chip 11 and a second edge-pad-type or peripheral-pad-type chip 12. The bonding pads 12 of the first chip 11 are disposed as two parallel lines adjacent a central axis of the chip and along the opposing edges perpendicular to the lines of center bonding pads. The bonding pads 14 of the second chip 13 are disposed along its periphery. As illustrated, both the first and second chips 11 and 13 are smaller than the leadframe pad 21 and may be mounted entirely within the outer periphery of the leadframe pad.

The first chip 11 includes a series of bonding pads 12 formed on an active surface thereof and is attached to a bottom surface of the leadframe pad 21 through adhesive means 31 in a manner that will expose the bonding pads within the central opening 22. The adhesive means 31 may be an adhesive tape, such as a polyimide tape, and is preferably arranged as a continuous band along the lower surface of the leadframe pad 21. The adhesive tape may utilize a single layer construction, such as a 25–50 $\mu$m polyimide film, or multi-layer construction, incorporating materials with different properties, such as a polyolefin/polyimide/polyolefin structure, in which one or more of the outer layers has a lower melting point than the inner layer(s) and provide more of the adhesive effect. The thickness of the layers in a multi-layer adhesive tape may also be varied as necessary to achieve the desired performance, such as a 12.5 $\mu$m/25 $\mu$m/12.51 $\mu$m tri-layer film comprising two outer adhesive layers and a core layer of polyimide. Suitable adhesive tapes include, for example, HM-121U-LT3 and HM-121U-LB3 which have an adhesive temperature of about 330° C. and may be cured at room temperature (approximately 25° C.) for attaching the chip to the leadframe. Other suitable adhesive tapes for use between the semiconductor chips include, for example, FH 800 and LE 5000, which may be attached to an epoxy adhesive and then cured at about 175° C. for about 30 minutes.

Such materials may be applied using equipment that can typically maintain mount stage temperatures of 300–350° C. and bond head temperatures of between about 200–250° C. In practice, however, the temperature range will typically be controlled within a more narrow range consistent with the particular materials selected and the process sequence utilized to achieve consistent bonding performance. The adhesive means 31 is preferred arraying in a continuous band for sealing the first chip 11 to the leadframe pad 21 so as to reduce leakage paths between the first chip and the leadframe during the subsequent application of an adhesive means. A first series of bonding wires 41 is then used to electrically connect bonding pads 12 on the first chip 11 to corresponding inner leads 23.

The second chip 13 having bonding pads 14 formed on an active surface may then be attached to the leadframe pad 21 by an adhesive means applied between the leadframe pad and the surface opposite the active surface, i.e., the backside. In this instance, the illustrated adhesive means includes a combination of a liquid adhesive 35 and a non-conductive adhesive tape 37 to affix the second chip 13 to the leadframe pad 21.

Liquid adhesives may also include spacer or filler particles, for instance spherical particles, that will tend to limit the minimum spacing between the second chip and the leadframe pad, thereby protecting the first series of bonding wires from contact with the backside of the second chip. Whatever adhesive means is selected, however, it will preferably be applied in a manner that substantially fills the space between the active surface of the first chip 11 and the surrounding portions of the leadframe pad and the backside of the second chip 13, including the central opening 22.

As illustrated in FIG. 17, a package body 51 may then be formed around the first and second chips 11 and 13, the inner leads 23 and the first and second series of bonding wires 41 and 43 by encapsulation with an EMC or other suitable thermoset polymeric composition. The outer leads 25, typically integrally formed with the inner leads, provide an electrical connection to the inner leads 23 and extend beyond the package body to provide for electrical connection of the resulting package to a circuit board, socket or other mounting receptacle. The outer leads 25 may be sized, cut, trimmed, bent and/or otherwise formed to produce packages having a wide range of mount configurations.

The implementation of this invention may reduce the likelihood of damage to semiconductor chips and bonding wires during the manufacture of multi-chip packages by eliminating the need to invert the leadframe. The implementation of this invention may also reduce the height of the wire loop relative to the leadframe pad, thereby allowing a thinner package to be produced.

Although certain preferred exemplary embodiments of the invention have been described in detail herein, it should be understood that many variations and/or modifications of the basic inventive concepts may be undertaken by those of skill in the art without departing from the spirit and scope of the invention as defined in the appended claims.

What is claimed is:

1. A multi-chip package comprising:
a leadframe having a leadframe pad, the leadframe pad having an upper surface and a lower surface;
a first chip having a first plurality of bonding pads arranged on a first active surface;
a first adhesive member arranged between a portion of the first active surface and a portion of the lower surface of the leadframe pad, the first adhesive member attaching the first chip to the leadframe pad;
a second chip having a second plurality of bonding pads formed on a second active surface and a backside surface opposite the second active surface;
a second adhesive member arranged between a portion of the backside surface and a portion of the upper surface of the leadframe pad, the second adhesive member attaching the second chip to the leadframe pad.

2. A multi-chip package according to claim 1, wherein:
the leadframe pad includes a central opening; and
the first chip is mounted to the lower surface of the leadframe pad in a manner that exposes at least a portion of the first plurality of bonding pads within the central opening.

3. A multi-chip package according to claim 1, wherein:
the leadframe pad includes a central opening; and
the first chip is mounted to the lower surface of the leadframe pad in a manner that exposes each of the first plurality of bonding pads within the central opening.

4. A multi-chip package according to claim 2, wherein:
the second adhesive member is formed from a combination of an adhesive tape member and a cured liquid adhesive.

5. A multi-chip package comprising:
a leadframe having a leadframe pad, the leadframe pad having an upper surface, a lower surface and a central opening, inner leads and outer leads, the inner leads being arranged around the leadframe pad;
a first chip having a first plurality of bonding pads arranged on a first active surface;
a first adhesive member arranged between a portion of the first active surface and a portion of the lower surface, the first adhesive member attaching the first chip to the leadframe pad;
a first plurality of bonding wires providing electrical connections between the first plurality of bonding pads and inner leads;
a second chip having a second plurality of bonding pads formed on a second active surface and a backside surface opposite the second active surface;
a second adhesive member arranged between a portion of the backside surface and a portion of the upper surface of the leadframe pad, the second adhesive member attaching the second chip to the leadframe pad;
a second plurality of bonding wires providing electrical connections between the second plurality of bonding pads and the inner leads;
a package body sealing the first and second chips, the first and second pluralities of bonding wires and the inner leads; and
outer leads extending from the package body providing external electrical connections to the inner leads.

6. A multi-chip package according to claim 5, wherein:
the second adhesive member substantially fills a volume defined by the first active surface, the leadframe pad, the backside surface and an outer periphery of the second chip.

7. A multi-chip package according to claim 6, wherein:
the second adhesive member included both an adhesive tape member and a cured liquid adhesive.

8. A multi-chip package according to claim 7, wherein:
the adhesive tape member is positioned around the central opening in the leadframe pad and, in combination with a portion of the first active surface, an inner surface of the first adhesive member and an inner surface of the leadframe pad, forms an adhesive cavity; and
the cured liquid adhesive member substantially fills the adhesive cavity.

9. A multi-chip package according to claim 5, wherein:
the first plurality of bonding pads are arranged within an inner periphery of the leadframe pad.

10. A multi-chip package according to claim 9, wherein:
the first plurality of bonding pads are arranged to form a first pair and second pair of parallel rows;
the first pair of parallel rows being arranged generally symmetrically about and adjacent to a central axis of the first active surface; and
the second pair of parallel rows being arranged adjacent opposing edges of the first active surface.

11. A multi-chip package according to claim 10, wherein:
the first pair of parallel rows are substantially perpendicular to the second pair of parallel rows.

12. A multi-chip package according to claim 5, wherein:
the first plurality of bonding pads include a first group and a second group,
the first group being arranged within an inner periphery of the leadframe pad and the second group being arranged outside an outer periphery of the leadframe pad.

13. A multi-chip package according to claim 5, wherein: the second adhesive member is formed substantially from a cured liquid adhesive composition.

14. A multi-chip package according to claim 13, wherein: the liquid adhesive composition is a nonconductive epoxy resin.

15. A multi-chip package according to claim 5, wherein: the first chip extends beyond an outer periphery of the leadframe pad.

16. A method of manufacturing a multi-chip package comprising:

forming a leadframe having a leadframe pad, the leadframe pad having an upper surface and a lower surface;

attaching a first chip having a first plurality of bonding pads arranged on a first active surface to the lower surface of the leadframe pad using a first adhesive member, the first adhesive member being arranged between a portion of the first active surface and a portion of the lower surface of the leadframe pad; and attaching a second chip having a second plurality of bonding pads formed on a second active surface and a backside surface opposite the second active surface to the upper surface of the leadframe pad using a second adhesive member, the second adhesive member being arranged between a portion of the backside surface and a portion of the upper surface of the leadframe pad.

17. A method of manufacturing a multi-chip package comprising:

forming a leadframe having a leadframe pad, the leadframe pad having an upper surface, a lower surface and a central opening, inner leads and outer leads, the inner leads being arranged around the leadframe pad and being in electrical contact with corresponding outer leads;

attaching a first chip having a first plurality of bonding pads arranged on a first active surface to the lower surface of the leadframe pad using a first adhesive member, the first adhesive member being arranged between a portion of the first active surface and a portion of the lower surface;

forming a first plurality of bonding wires between the first plurality of bonding pads and the inner leads;

attaching a second chip having a second plurality of bonding pads formed on a second active surface and a backside surface opposite the second active surface to the upper surface of the leadframe pad using a second adhesive member, the second adhesive member being arranged between a portion of the backside surface and a portion of the upper surface of the leadframe pad;

forming a second plurality of bonding wires between the second plurality of bonding pads and the inner leads;

forming a package body encapsulating the first and second chips, the first and second pluralities of bonding wires and the inner leads; and forming the outer leads into a predetermined configuration.

18. A method of manufacturing a multi-chip package configured according to claim 5, comprising:

forming the leadframe;

attaching the first chip to the lower surface of the leadframe pad using the first adhesive member;

forming the first plurality of bonding wires between the first plurality of bonding pads and the inner leads;

attaching the second chip to the upper surface of the leadframe pad using the second adhesive member;

forming the second plurality of bonding wires between the second plurality of bonding pads and the inner leads;

forming the package body encapsulating the first and second chips, the first and second pluralities of bonding wires and the inner leads; and forming the outer leads into a predetermined configuration.

* * * * *